United States Patent
Nakamiya et al.

(10) Patent No.: US 7,638,975 B2
(45) Date of Patent: Dec. 29, 2009

(54) POWER SUPPLY CONTROL CIRCUIT, ELECTRONIC APPARATUS, SEMICONDUCTOR DEVICE, CONTROL METHOD FOR POWER SUPPLY CONTROL CIRCUIT, AND CONTROL METHOD FOR ELECTRONIC APPARATUS

(75) Inventors: Shinji Nakamiya, Matsumoto (JP); Hidenori Nakamura, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 356 days.

(21) Appl. No.: 11/287,304

(22) Filed: Nov. 28, 2005

(65) Prior Publication Data
US 2006/0091860 A1    May 4, 2006

(30) Foreign Application Priority Data
Nov. 29, 2004    (JP)    ............... 2004-344928

(51) Int. Cl.
H02J 7/24    (2006.01)
H02J 7/00    (2006.01)
H02J 7/04    (2006.01)

(52) U.S. Cl. .................. 320/134; 320/165; 320/164; 320/136; 320/149

(58) Field of Classification Search .................. 320/134, 320/137, 165, 135, 149, 136, 164
See application file for complete search history.

(56) References Cited

U.S. PATENT DOCUMENTS

| | | | |
|---|---|---|---|
| 4,714,868 A | 12/1987 | Maruyama et al. | |
| 4,733,383 A | 3/1988 | Waterbury | |
| 5,672,952 A | 9/1997 | Szepesi | |
| 5,726,505 A | 3/1998 | Yamada et al. | |
| 5,847,544 A * | 12/1998 | Eguchi | 320/136 |
| 5,872,445 A * | 2/1999 | Ozawa et al. | 320/137 |
| 5,959,439 A * | 9/1999 | Shenai et al. | 323/222 |
| 7,145,313 B2 * | 12/2006 | Geren et al. | 320/134 |
| 2003/0201760 A1 * | 10/2003 | Umemoto et al. | 323/271 |
| 2004/0164711 A1 | 8/2004 | Hayashi | |
| 2005/0253556 A1 * | 11/2005 | Kuiri | 320/128 |

FOREIGN PATENT DOCUMENTS

| | | |
|---|---|---|
| DE | 10112921 A1 | 9/2002 |
| JP | S61-210827 A | 9/1986 |

(Continued)

*Primary Examiner*—Edward Tso
*Assistant Examiner*—Alexix Boateng
(74) *Attorney, Agent, or Firm*—Global IP Counselors, LLP

(57) ABSTRACT

A power supply apparatus 11 and a storage device 12 that stores power supplied by the power supply apparatus 11 interpose a power supply control circuit 10. The circuit has a charging current detector 13 to detect charging current IC flowing from the power supply apparatus 11 to the storage device 12; a blocking unit 15 to interrupt the backflow current IR that flows from the storage device to the power supply apparatus on the basis of an inputted blocking control signal SH; and a backflow monitoring unit 14 to monitor by sampling for the presence of the charging current IC until the charging current IC is detected, constantly to monitor for the presence of the charging current IC after the charging current IC has been detected, and to output a blocking control signal SH for cutting off the backflow current IR when the charging current IC is not flowing.

24 Claims, 7 Drawing Sheets

FOREIGN PATENT DOCUMENTS

| | | |
|---|---|---|
| JP | H09-251818 A | 9/1996 |
| JP | H09-264971 A | 10/1997 |
| JP | H10-201128 A | 7/1998 |
| JP | H10-210681 A | 8/1998 |
| JP | 2000-092543 A | 3/2000 |
| JP | 2000-134705 A | 5/2000 |
| JP | 2004-254386 A | 9/2004 |
| JP | 2004-260910 A | 9/2004 |
| JP | 2004-320873 A | 11/2004 |
| WO | WO-98/21815 A1 | 5/1998 |

\* cited by examiner

POWER SUPPLY CONTROL CIRCUIT, ELECTRONIC APPARATUS, SEMICONDUCTOR DEVICE, CONTROL METHOD FOR POWER SUPPLY CONTROL CIRCUIT, AND CONTROL METHOD FOR ELECTRONIC APPARATUS

CROSS-REFERENCE TO RELATED APPLICATIONS

This application claims priority to Japanese Patent Application No. 2004-344928. The entire disclosure of Japanese Patent Application No. 2004-344928 is hereby incorporated herein by reference.

BACKGROUND OF THE INVENTION

1. Field of the Invention

The present invention generally relates to a power supply control circuit. More specifically, the present invention relates to a power supply control circuit, electronic apparatus, semiconductor device, control method for a power supply control circuit, and control method for an electronic apparatus, and even more specifically relates to a power supply control circuit, electronic apparatus, semiconductor device, control method for a power supply control circuit, and control method for an electronic apparatus of the type in which electricity generated by a power generation apparatus is stored in a storage device.

2. Background Information

Power supply control circuits provided with an electronic clock that includes a power generation apparatus, wherein the electrical energy generated by the power generation apparatus is stored in a storage device via a so-called blocking diode are conventionally known. For example, Japanese Laid-Open Patent Application No. 9-264971, Japanese Laid-Open Patent Application No. 10-201128, and Japanese Laid-Open Patent Application No. 10-210681 show this type of control circuit.

However, when a solar battery is used as the power supply apparatus, the charging current characteristics of the solar battery include a characteristic whereby a fixed charging current flows until the stored voltage of the storage device reaches a prescribed voltage X(V), and the charging current stops flowing when the stored voltage reaches the prescribed voltage X(V).

In this case, when the configuration includes an ideal power supply control circuit in which a blocking diode is not used, the voltage X is equal to the charging voltage of the storage device. However, in an actual power supply control circuit that uses a blocking diode, the voltage X is equal to the sum of the charging voltage of the storage device and the forward voltage of the blocking diode. Thus, there is a drawback in that charging current of the storage device charges in less than ideal conditions. In other words, the forward voltage of the blocking diode essentially appears as a charge loss.

In the particular case of charging a solar battery under low illumination, since the voltage X is reduced in comparison with high illumination, there is a drawback in that the ratio of charging loss is considerable.

When an attempt is made to install a blocking diode in a semiconductor device (LSI, for example), the impurities in the silicon substrate are commonly diffused to form a p-type diffusion layer and an n-type diffusion layer, and these are structured as a diode by a PN junction. However, since the diode formed by a PN junction on the silicon substrate has a considerable forward voltage, the charging loss increases and the charging efficiency is reduced.

As shown in International publication WO98/21815, technology has been proposed (refer to patent reference 4) to solve the above-described problems, in which a field-effect transistor is connected to a blocking diode in parallel with the blocking diode, electrical energy generated by a power generation apparatus initially charges a storage device by way of the blocking diode, the field-effect transistor is switched ON and the blocking diode is bypassed when the forward voltage of the blocking diode is equal to or greater than a prescribed voltage, and the storage device is charged in a state of low charging loss.

No problems are encountered when a constant-voltage power generation apparatus such as an electromagnetic induction generation apparatus is used for the power generation apparatus to generate a charging current in correspondence with the difference in electrical potential between the power generation voltage of the power generation apparatus and the charging voltage of the storage device. However, in the case that a constant-current power generation apparatus such as a solar battery is used, the blocking diode is shorted by the field-effect transistor and the forward voltage becomes zero when the forward voltage of the blocking diode is detected and the field-effect transistor is switched ON, causing the field-effect transistor to be switched OFF one more time.

When a constant-current power generation apparatus is therefore used as a power generation apparatus, problems are encountered in that the charging loss is not reduced because the storage device is charged as the field-effect transistor repeatedly switches ON and OFF.

When using a configuration in which the field-effect transistor is kept in the ON state for a prescribed length of time, electric current flows back from the storage device to the power supply apparatus when the power generation apparatus no longer produces electricity during that period of time, and a new problem arises in that power is wastefully consumed.

In the present invention, it is possible to enhance battery charge efficiency of an electric timepiece and a portable electric apparatus having a generator or battery and to elongate drivable time, by reducing power loss in charging and power leak, in a power supply circuit.

In view of the above, it will be apparent to those skilled in the art from this disclosure that there exists a need for an improved power supply control circuit, electronic apparatus, semiconductor device, control method for a power supply control circuit, and control method for an electronic apparatus. This invention addresses this need in the art as well as other needs, which will become apparent to those skilled in the art from this disclosure.

SUMMARY OF THE INVENTION

In view of the above, an object of the present invention is to provide a power supply control circuit having low charging loss and low-leak electric current regardless of the type of power supply apparatus, and to provide consequently a power supply control circuit in which the charging efficiency is improved in an electronic apparatus that has a power supply apparatus or a charging device, and in which the length of time that the system can operate is extended, and to provide further an electronic apparatus, a semiconductor device, a control method for a power supply control circuit, and a control method for the electronic apparatus.

In order to solve the above-described problems, a first aspect of the present invention provides a power supply control circuit interposed between a power supply apparatus and a storage device that stores power supplied by the power supply apparatus, to control the electric current that flows between the power supply apparatus and the storage device. The circuit includes a charging current detector, a blocking unit, and a backflow monitoring unit. The charging current detector detects the charging current flowing from the power supply apparatus to the storage device. The blocking unit cuts off the backflow current that flows from the storage device to the power supply apparatus, on the basis of inputted blocking control signal. The backflow monitoring unit monitors by sampling for the presence of the charging current until the charging current is detected, constantly monitors for the presence of the charging current after the charging current has been detected, and outputs a blocking control signal to cut off the backflow current when the charging current is not flowing.

In accordance with the above-described configuration, the charging current detector detects the charging current that flows from the power supply apparatus to the storage device. The backflow monitoring unit monitors by sampling for the presence of electric current on the basis of the detection results of the charging current detector until the charging current is detected, constantly monitors for the presence of a charging current after the charging current has been detected, and presents the blocking unit with a blocking control signal to cut off the backflow current when the charging current is not flowing. As a result, the blocking unit cuts off backflow current that flows from the storage device to the power supply apparatus, on the basis of the inputted blocking control signal.

A power supply control circuit according to a second aspect of the present invention is the circuit of the first aspect, wherein the charging current detector is provided with a first field-effect transistor in which either one of the drain and source terminals is connected to the gate terminal. Further, the first field-effect transistor is directly or indirectly connected to one of the terminals of the storage device, and the other of the drain and source terminals is connected to one of the terminals of the power supply apparatus. Moreover, the blocking unit is provided with a second field-effect transistor in which either one of the drain and source terminals is connected to the other terminal of the power supply apparatus, and in which the other of the drain and source terminals is directly or indirectly connected to the other terminal of the storage device.

A power supply control circuit according to a third aspect of the present invention is the circuit of the second aspect, wherein the second field-effect transistor may be configured to have a larger threshold value that the threshold value of the first field-effect transistor.

A power supply control circuit according to a fourth aspect of the present invention is the circuit of the third aspect, wherein the first field-effect transistor may be formed from an intrinsic semiconductor, and the second field-effect transistor may be configured so that the threshold value is set by controlling the concentration of impurities in the substrate.

A power supply control circuit according to a fifth aspect of the present invention is the circuit of any of the second to fourth aspects, wherein parasitic diodes in which the direction of flow of the charging current is the forward direction are provided in parallel with the first field-effect transistor and the second field-effect transistor.

A power supply control circuit according to a sixth aspect of the present invention is the circuit of any one of the second to fifth aspects, wherein the first and second field-effect transistors may be enhancement-type field-effect transistors.

A power supply control circuit according to a seventh aspect of the present invention is the circuit of any of the second to fifth aspects, wherein the first field-effect transistor may be a depletion-type field-effect transistor, and the second field-effect transistor may be an enhancement-type field-effect transistor.

A power supply control circuit according to a eighth aspect of the present invention is the circuit of any of the second to seventh aspects, wherein the backflow monitoring unit may be provided with a comparator for detecting the difference in electrical potential generated between the drain and source terminals of the first field-effect transistor. Further, the comparator may be adapted to perform a sampling operation in a state in which there is a possibility that backflow current can flow, based on the difference in electrical potential, and to operates constantly in a state in which the charging current is flowing.

A power supply control circuit according to a ninth aspect of the present invention is the circuit of the eighth aspect, wherein the resistance load element to stabilize the electrical potential of one of the terminals of the power supply apparatus may also be connected in parallel with the first field-effect transistor.

A power supply control circuit according to a tenth aspect of the present invention is the circuit of any of first to ninth aspects, wherein the a power generation apparatus may furthermore be connected as the power supply apparatus.

A power supply control circuit according to an eleventh aspect of the present invention is the circuit of the tenth aspect, wherein the a constant-current power generation apparatus that can cause a substantially constant charging current to flow without dependence on storage voltage until the storage voltage of the storage device reaches a prescribed level under prescribed power generation conditions may moreover be connected as the power supply apparatus.

A power supply control circuit according to a twelfth aspect of the present invention is the circuit of any one of the second to eleventh aspects wherein a switching element is provided to prevent overcharging of the storage device and to allow charging current fed from the power supply apparatus to flow to the power supply apparatus via the first field-effect transistor, wherein the backflow monitoring unit has a storage voltage detector to detect the storage voltage of the storage device, and forcibly sets the second field-effect transistor in an OFF state, and thereafter sets the switching element in an ON state when the storage voltage of the storage device is equal to or greater than a prescribed reference voltage. Further, when the second field-effect transistor is forcibly set in the OFF state and the switching element is set in the ON state, the switching element is set in the OFF state and the forced OFF state of the second field-effect transistor is released when the storage voltage is less than the reference voltage.

A thirteenth aspect of the present invention also provides an electronic apparatus that has a storage device to store power supplied by an external power supply apparatus, a controlled device driven by the stored power of the storage device, and a power supply control circuit interposed between the power supply apparatus and storage device, to control the electric current that flows between the power supply apparatus and the storage device. Further, the power supply control circuit includes a changing current detector, a blocking unit, and a backflow monitoring unit. The charging current detector detects charging current that flows from the power supply apparatus to the storage device. The blocking unit cuts off backflow current that flows from the storage device to the power supply apparatus, on the basis of an inputted backflow control signal. The backflow monitoring unit monitors by sampling for the presence of the charging current until the charging current is detected, constantly monitors for the presence of the charging current after the charging current has been detected, and outputs a blocking control signal to cut off the backflow current when the charging current is not flowing.

In accordance with the above configuration, the charging current detector of the power supply control circuit detects charging current that flows from an external power supply apparatus to the storage device.

The backflow monitoring unit monitors by sampling for the presence of the charging current until the charging current is detected, on the basis of the charging current detector; constantly monitors for the presence of the charging current after the charging current has been detected. Further, the backflow monitor unit outputs to the blocking unit a blocking control signal to cut off backflow current when the charging current is not flowing. As a result, the blocking unit cuts off back flow current that flows from the storage device to the power supply apparatus, on the basis of the inputted backflow control signal.

A fourteenth aspect of the present invention also provides an electronic apparatus that has a power supply apparatus, a storage device to store power supplied by the power supply apparatus, a controlled device driven by the stored power of the storage device, and a power supply control circuit interposed between the power supply apparatus and storage device to control the electric current that flows between the power supply apparatus and the storage device. Further, the power supply control circuit includes a charging current detector, a blocking unit, and a backflow monitoring unit. The charging current detector detects charging current that flows from the power supply apparatus to the storage device. The blocking unit cuts off backflow current that flows from the storage device to the power supply apparatus, on the basis of an inputted backflow control signal. The backflow monitoring unit monitors by sampling for the presence of the charging current until the charging current is detected, constantly monitors for the presence of the charging current after the charging current has been detected, and outputs a blocking control signal to cut off the backflow current when the charging current is not flowing.

In accordance with the above configuration, the charging current detector of the power supply control circuit detects charging current that flows from the power supply apparatus to the storage device. The backflow monitoring unit monitors by sampling for the presence of the charging current until the charging current is detected, on the basis of the charging current detector. Further, the backflow monitoring unit constantly monitors for the presence of the charging current after the charging current has been detected, and outputs to the blocking unit a blocking control signal to cut off backflow current when the charging current is not flowing. As a result, the blocking unit cuts off back flow current that flows from the storage device to the power supply apparatus, on the basis of the inputted backflow control signal.

An electronic apparatus according to a fifteenth aspect of the present invention is the apparatus of the thirteenth or fourteenth aspect, wherein the controlled device may be configured as a microcomputer.

An electronic apparatus according to a sixteenth aspect of the present invention is the apparatus of the fifteenth aspect, wherein the microcomputer includes a central processing unit, and the control of the power supply control apparatus may be carried out independently from the control of the central processing unit.

An electronic apparatus according to a seventeenth aspect of the present invention is the apparatus of any one of the thirteenth or sixteenth aspects, wherein the controlled device may furthermore be configured as a timing device having a timing function and a time display function.

An electronic apparatus according to a eighteenth aspect of the present invention is the apparatus of any one of the thirteenth to seventeenth aspects, wherein the power supply apparatus may moreover be a power generation apparatus.

A nineteenth aspect of the present invention also provides a semiconductor device that includes a terminal to which a power supply apparatus is connected, a terminal to which the storage device is connected, a terminal to which a controlled device driven with the stored power of the storage device is connected, and any power supply control circuit of those described above.

A twentieth aspect of the present invention provides a control method for a power supply control circuit that includes a charging current detection step to detect charging current that flows from the power supply apparatus to the storage device, a monitoring step to monitor by sampling for the presence of the charging current until the charging current is detected, and constantly monitoring for the presence of charging current after the charging current has been detected, and a blocking step to cut off backflow current when the charging current is not flowing.

A twenty-first aspect of the present invention provides a control method for an electronic apparatus which houses a power supply apparatus or to which an external power supply apparatus can be connected, having a storage device that is charged by the power supply apparatus, a controlled device driven with the stored power of the storage device, and a power supply control circuit interposed between the power supply apparatus and storage device, to control the electric current that flows between the power supply apparatus and the storage device. The method includes a charging current detection step to detect charging current that flows from the power supply apparatus to the storage device; a monitoring step to monitor by sampling for the presence of the charging current until the charging current is detected, and constantly monitoring for the presence of charging current after the charging current has been detected; and a blocking step to cut off backflow current when the charging current is not flowing.

In accordance with the present invention, a power supply control circuit with a low charging loss and low leak electric current regardless of the type of power supply apparatus is provided. Hence, the charging efficiency is improved in an electronic apparatus that has a power supply apparatus or a charging device, and the length of time that the system can operate can be extended.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents. First, the basic principles of the present invention are described prior to a detailed description thereof.

Figure 1:
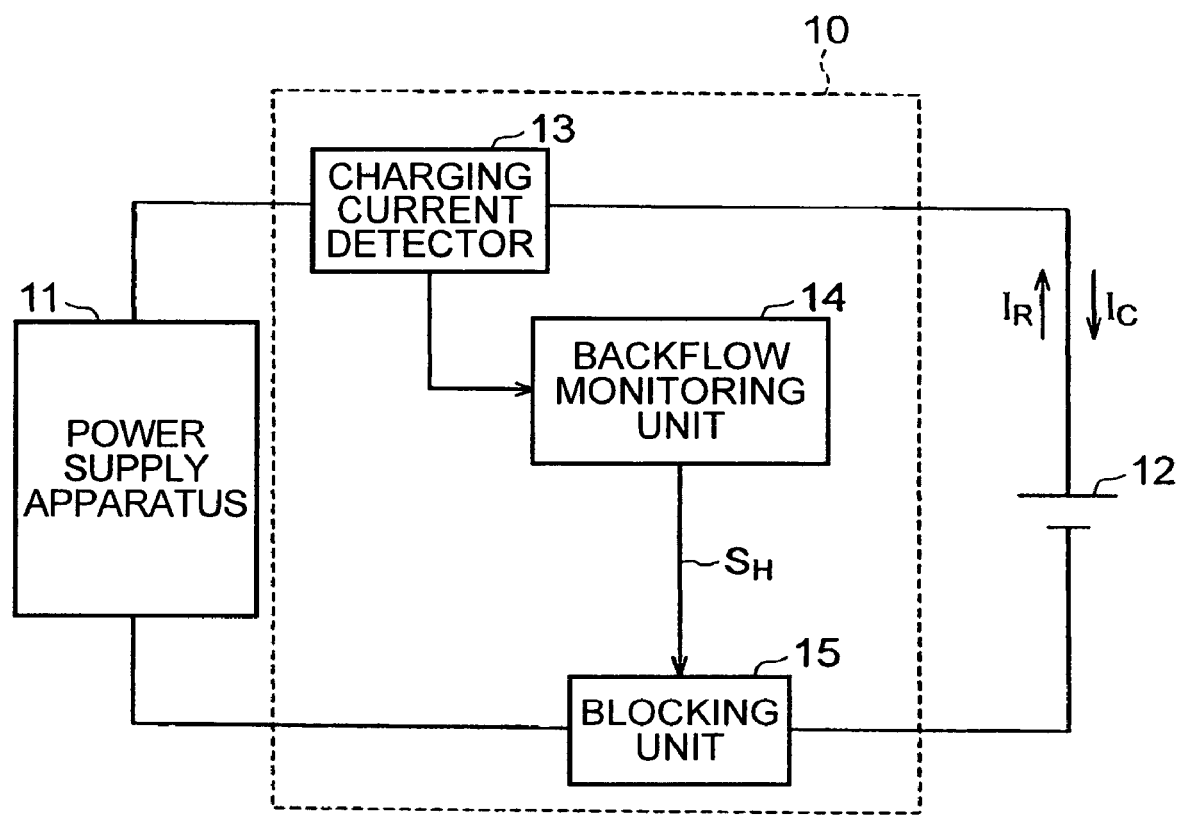
FIG. 1 is a view of a schematic diagram of the basic structure of an electronic apparatus according a first preferred embodiment of the present invention.

FIG. 1 is a view of a schematic diagram of the basic structure of an electronic apparatus according to a first preferred embodiment of the present invention. A power supply control circuit 10 is interposed between a power supply apparatus 111 and a storage device 12 that is charged by the power supply apparatus 11. In this case, the power supply control circuit 10 is roughly composed of a charging current detector 13, a backflow monitoring unit 14, and blocking unit 15. The charging current detector 13 detects charging current IC flowing from the power supply apparatus 11 to the storage device 12, and allows charging current IC to flow to the storage device 12. The backflow monitoring unit 14 monitors by sampling for the presence of charging current IC until charging current IC is detected via the charging current detector 13, constantly monitors for the presence of charging current IC once the charging current IC is detected via the charging current detector 13, and outputs a blocking control signal SH to cut off backflow current IR that flows from the storage device 12 to the power supply apparatus 11 when charging current IC is not flowing. The blocking unit 15 cuts off backflow current IR that flows from the storage device 12 to the power supply apparatus 111 on the basis of the inputted blocking control signal SH.

In accordance with the above-described configuration, the backflow monitoring unit 14 monitors by sampling for the presence of charging current IC until charging current IC is detected via the charging current detector 13.

When the charging current IC is thereafter detected via the charging current detector 13, the backflow monitoring unit 14 constantly monitors the charging current IC, and when the charging current IC is not flowing, a blocking control signal SH is output to the blocking unit 15 to cut off backflow current IR that flows from the storage device 12 to the power supply apparatus 11. As a result, the blocking unit 15 cuts off the backflow current IR that flows from the storage device 12 to the power supply apparatus 11 on the basis of the inputted blocking control signal SH.

As described above, in accordance with the power supply control circuit 10, the backflow monitoring unit 14 can ensure lower power consumption needed to monitor because the presence of charging current IC is monitored by sampling until charging current IC is detected via the charging current detector 13.

The backflow monitoring unit 14 constantly monitors the presence of charging current IC when charging current IC is detected via the charging current detector 13, and when electricity is not being generated in the power supply apparatus 11 or when the power generating voltage is lower than the charging voltage of the storage device 12, backflow current IR can be rapidly and reliably cut off under conditions in which there is a possibility that backflow current IR that flows from the storage device 12 to the power supply apparatus 11 will be generated. In this case, power consumption increases in comparison with the case in which the charging current IC is monitored by sampling, but the increase in the power consumption is not a problem because the storage device 12 is being charged.

The following is a description of a more concrete example of the present embodiment.

Figure 2:
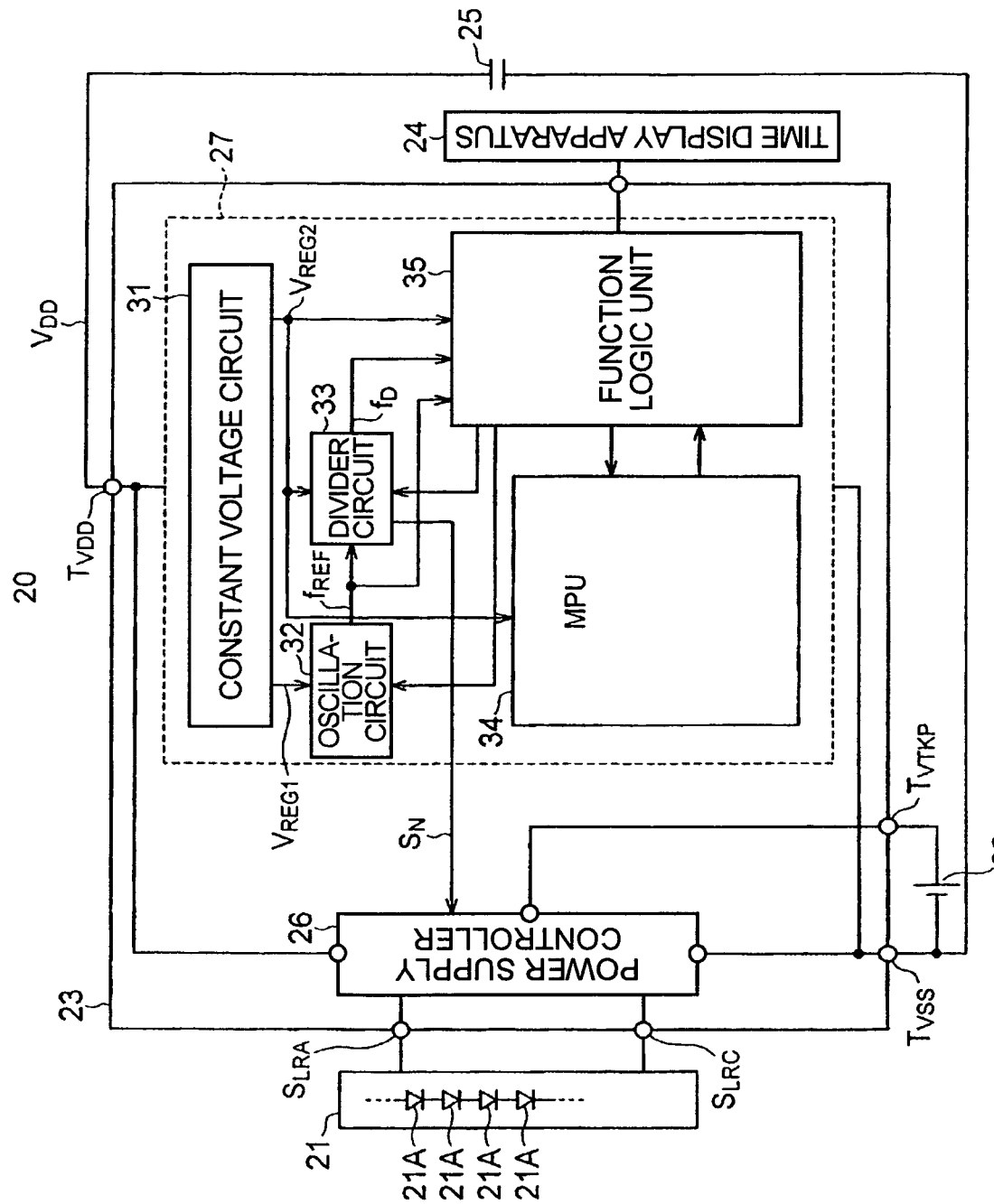
FIG. 2 is a view of a schematic block diagram of an electronic clock in accordance with the present embodiment.

FIG. 2 is a view of a schematic block diagram of the electronic apparatus of a concrete example of the present embodiment. In FIG. 2, an electronic clock that displays time is used as an example of the electronic apparatus. The electronic clock 20 is composed of a power generation apparatus 21, a storage device 22, a microcomputer 23, a time display apparatus 24, and an auxiliary capacitor 25. The power generation apparatus 21 is a power supply apparatus that is configured as a solar battery in which a plurality of cells 21A is connected in series and is made to receive sunlight to generate electricity. The storage device 22 stores power produced (electrical generation) by the power generation apparatus 21. The microcomputer 23 is connected to the power generation apparatus 21 by way of power source terminals SLRA and SLRC, is connected to the storage device 22 by way of a lower-potential power source terminal TVSS and a charge terminal TVTKP, and controls charging and time display. The time display apparatus 24 displays time under the control of the microcomputer 23. The auxiliary capacitor 25 is connected to the microcomputer 23 via a higher-potential power source terminal TVDD and the lower-potential power source terminal TVSS, and functions as a auxiliary power source of the storage device 22 when the time display apparatus 24 operates under a heavy load.

In this case, the microcomputer 23 is composed of a power supply controller 26 and a controller 27. The power supply controller 26 is connected to the storage device 22 via the lower-potential power source terminal TVSS and the charge terminal TVTKP, feeds charging current from the power generation apparatus 21 to the storage device 22, and prevents backflow current that flows from the storage device 22 to the power generation apparatus 21. The controller 27 operates independent of the power supply controller 26 and controls the entire electronic clock 20.

The controller 27 has a constant voltage circuit 31, an oscillation circuit 32, a driver circuit 33, an MPU 34, and a function logic unit 35. Operating voltage is fed to the constant voltage circuit 31 via the higher-potential power source terminal TVDD and lower-potential power source terminal TVSS. Further, the constant voltage circuit 31 feeds constant voltage VREG1 or constant voltage VREG2 to the components of the controller 27. The oscillation circuit 32, to which constant voltage VREG1 is fed, is provided with a liquid crystal oscillator or the like (not shown), and outputs a reference oscillation signal FREF having a prescribed frequency (32 kHz, for example). The divider circuit 33, to which the constant voltage VREG2 and the reference oscillation signal FREF are fed, divides the reference oscillation signal FREF, and outputs divided signals fD (only one is shown in FIG. 2 for diagramming simplicity) having various frequencies. The MPU 34, to which constant voltage VREG2 is fed, is provided with ROM, RAM, CPU (not shown) that control the entire controller 27. The function logic unit 35, to which constant voltage VREG2 and divided signals fD are fed, controls the time display in the time display apparatus 24 while operating in coordination with the MPU 34 to control the oscillation circuit 32 and divider circuit 33.

Following is a description of the configuration of the power supply controller 26.

Figure 3:
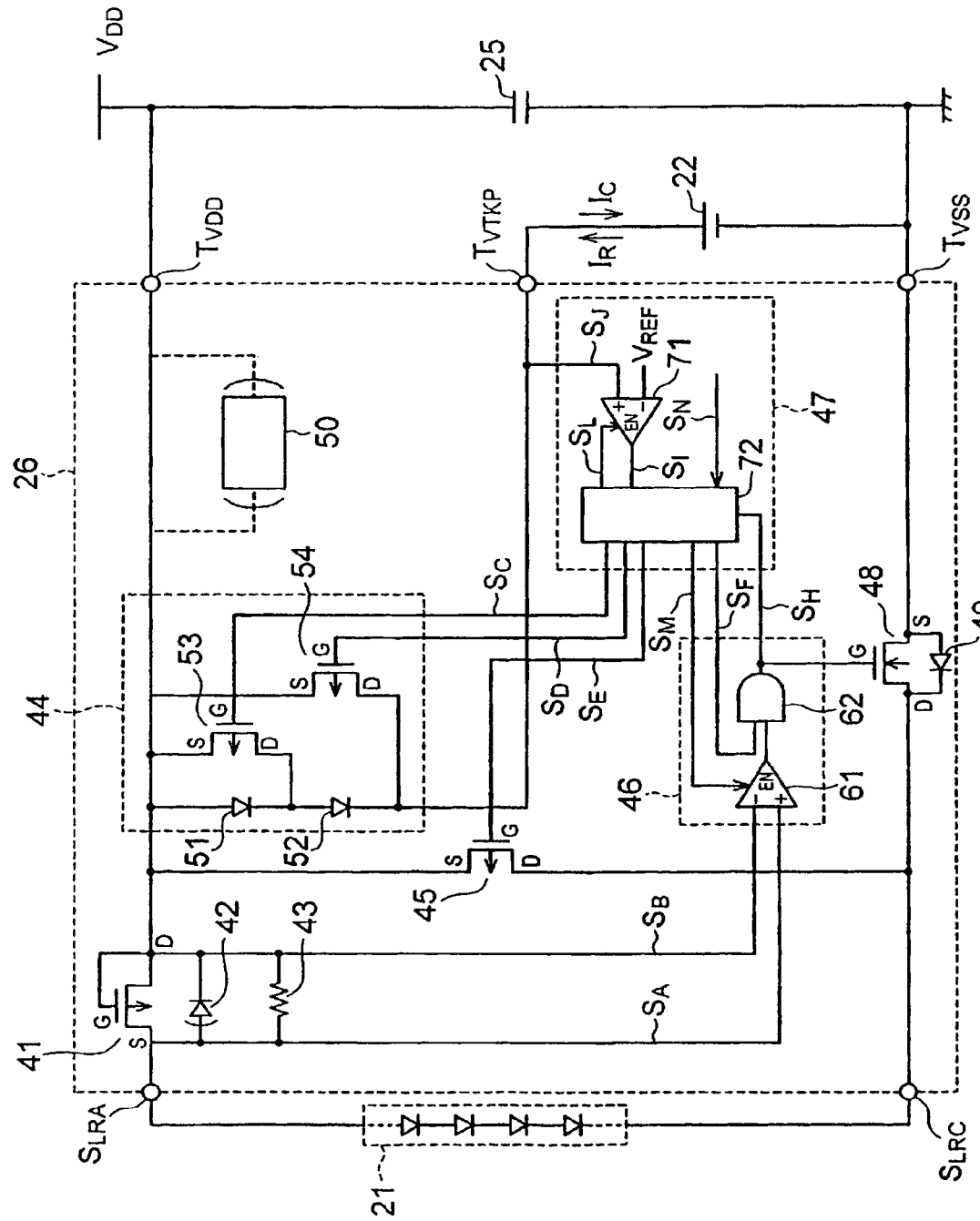
FIG. 3 is a view of a schematic block diagram of a power supply controller of the electronic clock.

FIG. 3 is a view of a schematic block diagram of the power supply controller 26. In FIG. 3, the same symbols are assigned to the same components as those shown in FIG. 2.

The power supply controller 26 is roughly composed of a charging current detection transistor 41, a diode 42 and pull-up resistance 43, a quick start unit 44, an excess charge prevention transistor 45, a comparator unit 46, an operation controller 47, a charging current transistor 48, and a diode 49. The charging current detection transistor 41 functions as a charging current detector. The diode (parasitic diode) 42 and pull-up resistance 43 are connected in parallel to the charging current detection transistor 41. The quick start unit 44 is provided to implement the hereinafter-described quick start function. The excess charge prevention transistor 45 for preventing excess charging in the storage device 22. The comparator unit 46 and operation controller 47 constitute the backflow monitoring unit. The charging current transistor 48 functions as a blocking unit. The diode (parasitic diode) 49 is connected in parallel to the charging current transistor 48. It should be noted that a voltage-increasing/decreasing circuit 50 that increases or decreases the storage voltage VTKP of the storage device 22 may also be provided as necessary.

The components of the power supply controller 26 are described in detail below.

The charging current detection transistor 41 is composed of a p-channel MOSFET, and is preferably large and has a low threshold voltage so that a considerable electric potential VDS (which causes charging loss) is not generated between the drain and source. In view of the above, a p-channel MOSFET is adopted in the present embodiment with a configuration in which the concentration of impurities of the base substrate is low and impurities are not required to be implanted to reduce the threshold voltage. An intrinsic semiconductor is defined as a semiconductor that does not require a special step to reduce the threshold voltage in such a manner. Even if a substrate that inherently has a fairly high degree of impurity concentration is used, it is possible to reduce the threshold voltage by implanting impurities in the substrate or making the oxide film thinner, but a dedicated semiconductor manufacturing step is required, resulting in higher costs. A substrate that inherently has a fairly high degree of impurity concentration is used during mass production as well in order to prevent an increase in the nonuniformity of the threshold voltage, that is, an increase in the nonuniformity of charging loss through mass production caused by an increase in the nonuniformity of the impurity concentration, nonuniformity of implanting impurities, nonuniformity in the thickness of the oxide layer, and other factors.

Figure 4:
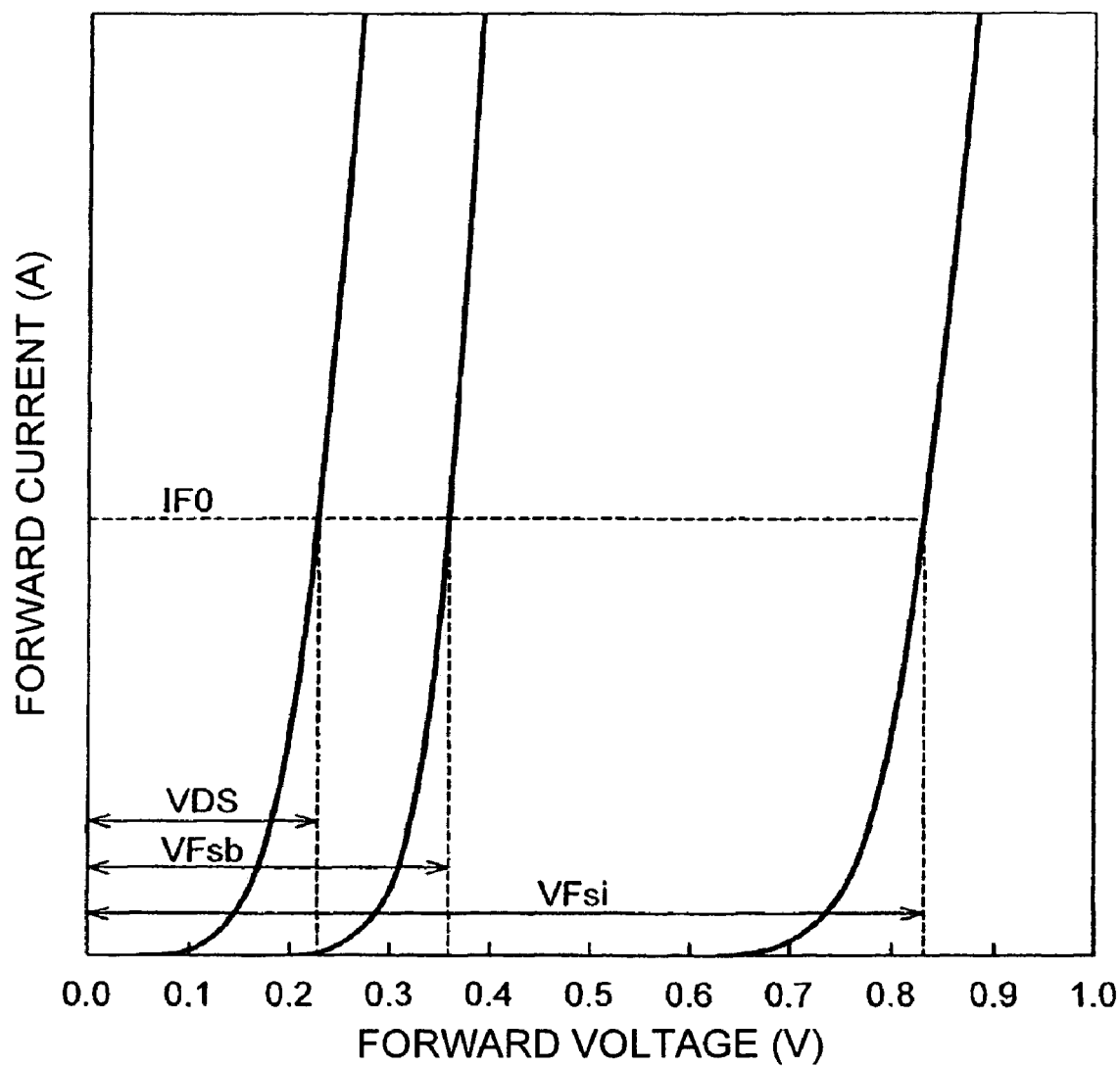
FIG. 4 is a view of a descriptive diagram of forward voltage-forward current characteristics of a device having a charging current detection transistor of the power supply controller and the same function.

FIG. 4 is a view of a descriptive diagram of the forward voltage-forward current characteristics of a device having a charging current detection transistor 41 and the same function.

FIG. 4 shows the voltage VDS between the drain terminal D and source terminal S of the charging current detection transistor 41, the voltage VFsi between the anode and cathode of a conventional silicon diode, and the voltage VFsb between the anode and cathode of a Schottky-barrier diode, when electric current with a value of IF0 flows as the charging current IC.

In comparison with the voltage VFsi between the anode and cathode of a conventional silicon diode, and the voltage VDsb between the anode and cathode of a Schottky-barrier diode, the voltage VDS between the drain terminal D and source terminal S of the charging current detection transistor 41 has a forward voltage of about 30 to 60%, and it is apparent that the charging loss is significantly lower. Since the charging current detection transistor 41 is adapted to have a low charging loss, it can always be inserted in the charging current pathway of the storage device 22 without providing a structure (bypass circuit or the like) to bypass the charging current detection transistor. The voltage VDS between the drain and source can be stably detected when charging current or backflow current flows without dependence on the type of power generation apparatus (constant-voltage power generation apparatus, constant-current power generation apparatus, and other power generation apparatuses).

As seem in FIG. 3, the quick start unit 44 is composed of a first quick start diode 51, a second quick start diode 52, a first quick start transistor 53, and a second quick start transistor 54. The first quick start diode 51 is arranged so that the anode terminal is connected to the drain terminal D of the charging current detection transistor 41. The second quick start diode 52 is connected in series to the first quick start diode 51. The first quick start transistor 53 is composed of a p-channel MOSFET, in which the source terminal S is connected to the drain terminal D of the charging current detection transistor 41, the drain terminal D is connected at a connection point midway between the first quick start diode 51 and second quick start diode 52, and the gate terminal G is connected to the operation controller 47. The second quick start transistor 54 is composed of a p-channel MOSFET, in which the source terminal S is connected to the drain terminal D of the charging current detection transistor 41, the drain terminal D is connected to the cathode terminal of the second quick start diode 52, and the gate terminal G is connected to the operation controller 47.

Here, the quick start function increases the voltage of the higher-potential power source VDD until the microcomputer 23 is in an operable voltage range by adding the charging voltage of the storage device 22 to the forward voltage obtained by allowing charging current IC from the power generation apparatus 21 to flow to the quick start diodes 51 and 52 to generate voltage in the quick start diodes 51 and 52, even if the stored voltage of the storage device 22 has discharged to a low voltage range in which the microcomputer 23 cannot operate.

More specifically, the quick start control transistors 53 and 54 are switched ON or OFF by the first quick start control signal SC and the second quick start control signal SD generated by the operation controller 47 to allow the quick start function to be active.

In this case, the reason for providing a separate bypass for each of the two quick start diodes 51 and 52 by using the quick start control transistors 53 and 54 is that the voltage does not rise to the operable voltage range of the microcomputer 23 even if the charging voltage of one of the quick start diodes is added to the stored voltage of the storage device 22. Further, when the quick start function is cancelled in a state in which the forward voltage generated by the two quick start diodes 51 and 52 has been added by the quick start function to the charged voltage of the storage device 22, the voltage of the higher-potential power source VDD applied to the microcomputer 23 falls precipitously, and the microcomputer 23 may malfunction when both of the quick start diodes 51 and 52 are bypassed at the same time. The configuration is therefore designed so that when the quick start function is cancelled, the first quick start diode 51 is first bypassed, and the second quick start diode 52 is then bypassed.

The excess charge prevention transistor 45 is composed of a p-channel MOSFET in which the source terminal S is connected to the drain terminal D of the charging current detection transistor 41, the drain terminal D is connected to the power generation apparatus 21 via the power source terminal SLRC, and the gate terminal G is connected to the operation controller 47.

The comparator unit 46 is composed a comparator 61 and an AND circuit 62. In the comparator 61, the inverting terminal (−) is connected (input as reference voltage signal SB) to the higher-potential power source VDD as the reference voltage power source via the higher-potential power source terminal TVDD, the non-inverting terminal (+) is connected (input as power generation voltage signal SA) to the power source terminal SLRA, and the enable terminal EN is connected to the operation controller 47. In the AND circuit 62, the output terminal of the comparator 61 is connected to one of the input terminals, the operation controller 47 is connected to the other input terminal, the forced-cutoff signal SF is input from the operation controller 47, and the blocking control signal SH is output therefrom.

The operation controller 47 is composed a comparator 71 and a logic circuit 72. In the comparator 71, the reference voltage VREF is input to the inverting terminal (−), the non-inverting terminal (+) is connected to the charge terminal TVTKP, and the storage voltage signal SJ that corresponds to the storage voltage of the storage device 22 is input thereto. In the logic circuit 72, the clock signal SN is input from the divider circuit 33, the blocking control signal SH is input from the AND circuit 62, the charging voltage detection result signal SI is input from the comparator 71, and the first quick start control signal SC, second quick start control signal SD, excess charge prevention control signal SE, forced-cutoff signal SF, enable signal SL, and sampling timing signal SM are output therefrom.

The charging current transistor 48 is composed of an n-channel MOS transistor in which the drain terminal D is connected to the power source terminal SLRC, the source terminal S is connected to the lower-potential power source terminal TVSS, the gate terminal G is connected to the output terminal of the AND circuit 62, and the blocking control signal SH is input to the gate terminal G. The charging current transistor 48 is set with a high threshold voltage, and when the power generation apparatus 21 is generating power, the charging loss is negligible because the voltage VDS between the drain and source is substantially zero since the transistor is configured to be ON when unsaturated.

The reasons for providing a charging current transistor 48 are described below. The charging current detection transistor 41 reduces the threshold voltage, which is designed to reduce the voltage VDS between the drain and source (which is the cause of charging loss). The leak electric current flows as a backflow current when the power generation apparatus 21 is not generating power. Therefore, in the present embodiment, the charging current transistor 48 is provided to cut off the leak current. Since the threshold voltage of the charging current transistor 48 is furthermore set higher than that of the charging current detection transistor 41, backflow current can be reliably cut off because the leak electric current is small value of about several nanoamperes.

The operation is more specifically described below.

Described first is an operation in the case in which charging current is flowing from the power generation apparatus 21 to the storage device 22.

Figure 5:
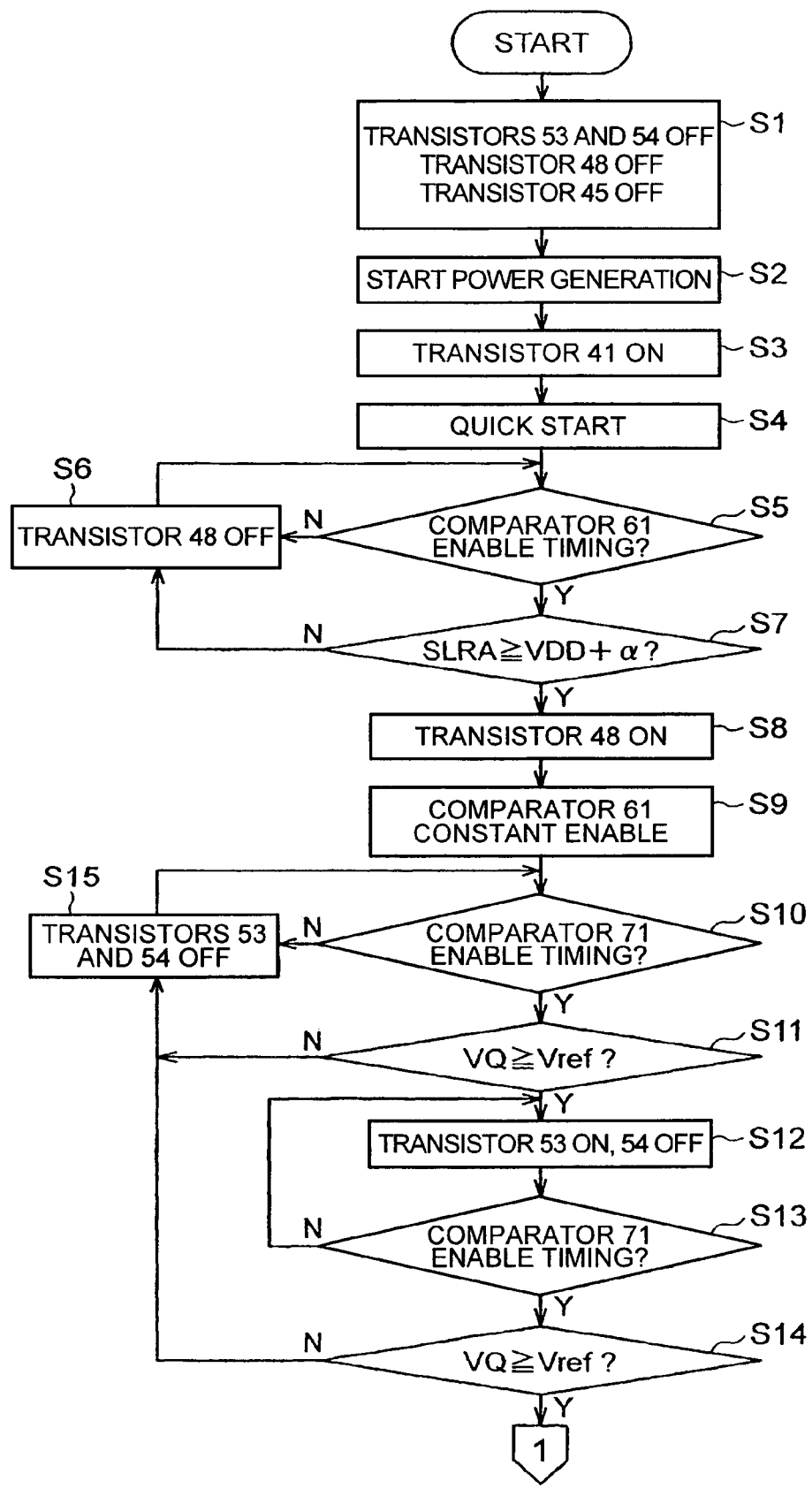
FIG. 5 is a view of an operation flowchart (part 1) illustrating a case in which charging current flows from the power supply apparatus to the storage device of the power supply controller.
Figure 6:
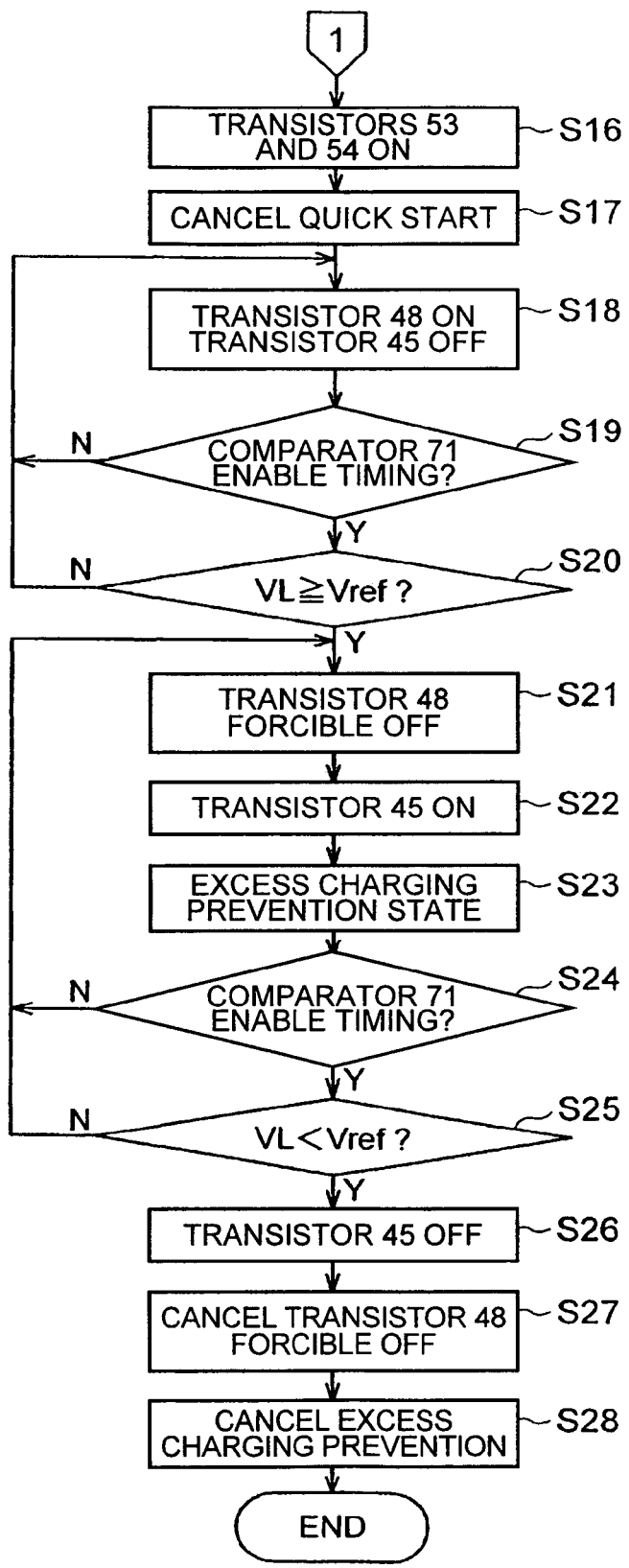
FIG. 6 is a view of an operation flowchart (part 2) further illustrating the case in which the charging current flows from the power supply apparatus to the storage device.

FIG. 5 is a view of a first part of an operation flowchart of a case in which charging current flows from the power supply apparatus to the storage device. FIG. 6 is a view of the second part of an operation flowchart of the case in which charging current flows from the power supply apparatus to the storage device. In the initial state, the microcomputer 23 is in an operation-halt state, and the storage voltage of the storage device 22 is lower than the operable voltage of the microcomputer 23.

In this state, the charging voltage detection result signal SI is at a low (L) level. The first quick start control signal SC and the second quick start control signal SD of the operation controller 47 are at a high (H) level. In other words, the quick start transistors 53 and 54 are both in an OFF state. The charging current transistor 48 and the excess charge prevention transistor 45 are also in an OFF state (Step S1).

As a result, the two quick start diodes 51 and 52 are connected in series to the storage device 22.

When power is generated (Step S2) in the power generation apparatus 21 in this state, a high-potential voltage is generated at the source terminal S with the voltage of the higher-potential power source VDD serving as the reference voltage because electric current from power generation flows from the power generation apparatus 21 to the source terminal S of the charging current detection transistor 41, the voltage of the higher-potential power source VDD is applied to the gate terminal G, and the voltage of the higher-potential power source VDD is also applied in the same manner to the drain terminal D. Since an electrical potential is generated between the gate and source (equivalent to the electrical potential VDS between the drain and source), the charging current detection transistor 41 is switched ON (Step S3).

Therefore, the quick start function is started (Step S4), the forward voltage of the two quick start diodes 51 and 52 is superimposed on the corresponding storage voltage of the storage device 22, and the microcomputer 23 (controller 27, in essence) is started.

In this state, a determination is made whether the sampling timing signal SM from the logic circuit 72 of the operation controller 47 has been input to the enable terminal EN of the comparator 61 of the comparator unit 46 (Step S5), and when the sampling timing signal SM has not been input to the enable terminal EN of the comparator 61 of the comparator unit 46 ("No," in Step S5), the OFF state of the charging current transistor 48 is maintained (Step S6).

Conversely, when the sampling timing signal SM has been input to the enable terminal EN of the comparator 61 of the comparator unit 46 ("Yes," in Step S5), the comparator 61 makes a determination whether the voltage of the power generation voltage signal SA is equal to or greater (SLRA≧VDD+α) than the voltage obtained by adding the voltage VDS between the drain and source of the charging current detection transistor 41 to the voltage of the higher-potential power source VDD (Step S7).

The comparator 61 is configured such that the input signal SA is connected to one end of a solar battery (which is the power generation apparatus 21), and the reference voltage signal SB is the voltage of the higher-potential power source VDD. Therefore, when the charging current IC is flowing, the voltage is made to correspond to the voltage VDS generated between the drain and source of the charging current detection transistor 41, and the detected voltage is equal to the voltage obtained by summing the voltage of the higher-potential power source VDD and the voltage VDS (=α) between the drain and source of the charging current detection transistor 41.

When power is not being generated in the power generation apparatus 21 and charging current IC is not flowing, the voltage of the power generation voltage signal SA is pulled up to the voltage of the higher-potential power source VDD by the pull-up resistance 43, and since a voltage difference with the reference voltage signal SB is not produced, charging current is not detected ("No," in Step S7). The charging current transistor 48 is therefore kept in an OFF state (Step S6). In this case, the pull-up resistance 43 functions to cut off the backflow current and to prevent situations in which the electrical potential of the power source terminal SLRA is unstable and the charging current non-detect state can no longer be stably detected in the comparator 61.

In this situation, the comparator 61 is enabled at each prescribed sampling timing cycle by the sampling timing signal SM from the logic circuit 72. The power consumption of the comparator 61 can be thereby inhibited, making it possible to ensure lower power consumption.

In the above-described sample timing, the comparator unit 46 compares the voltage (equivalent to the voltage of the higher-potential power source VDD) of the reference voltage signal SB and the voltage of the power generation voltage signal SA. When the voltage of the power generation voltage signal SA is equal to or greater than (SLRA≧VDD+α)) the voltage obtained by adding the voltage VDS between the drain and source of the charging current detection transistor 41 to the voltage of the higher-potential power source VDD, it is determined that charging current has been detected ("Yes," in Step S7), and the output signal thereof is set to a high level.

Since the forced-cutoff signal SF at this time is at a high level, the blocking control signal SH output from the AND circuit 62 is also at a high level. The charging current transistor 48 is switched ON (Step S8), and the charging current IC flows in the following order: power source terminal SLRA, charging current detection transistor 41, first quick start diode 51, second quick start diode 52, storage device 22, charging current transistor 48, and power source terminal SLRC.

The blocking control signal SH output at a high level from the AND circuit 62 is output to the logic circuit 72 as well.

The logic circuit 72 thereby constantly enables the sampling timing signal SM indicating that charging current has been detected, and the comparator 61 constantly operates (Step S9).

This is due to the fact that when the state changes from charging current detection to charging current non-detection, the charging current transistor 48 is immediately switched OFF, and the backflow current IR is rapidly and reliably prevented from flowing from the storage device 22 to the power generation apparatus 21.

In an excess charging prevention state, the forced-cutoff signal SF is at a low level, a charging current non-detection state is forcibly established, and a blocking control signal SH is output in order to switch forcibly ON the charging current transistor 48. As a result, in an excess charging prevention state, electric current flows via the excess charge prevention transistor 45 and charging current transistor 48, and the storage device 22 can be prevented from shorting.

The logic circuit 72 outputs an enable signal SL to the comparator 71 when a prescribed enable timing is reached ("Yes," in Step S10), and the comparator 71 compares (Step S11) the reference voltage VREF and the voltage of the storage voltage signal SJ corresponding to the stored voltage of the storage device 22 (in essence, the quick start control voltage VQ obtained by dividing the storage voltage signal SJ in a first prescribed ratio). When the quick start control voltage VQ is equal to or greater than the reference voltage VREF, the charging voltage detection result signal SI is set to a high level.

The logic circuit 72 thereby sets the first quick start control signal SC to a low level. As a result, the first quick start control transistor 53 is switched ON (Step S12), and the first quick start diode 51 is bypassed.

In other words, the charging current IC flows in the following order: power source terminal SLRA, charging current detection transistor 41, first quick start transistor 53, second quick start diode 52, storage device 22, charging current transistor 48, and power source terminal SLRC.

The logic circuit 72 thereafter outputs a prescribed enable signal SL to the comparator 71 ("Yes," in Step S13), the comparator 71 compares the reference voltage VREF and the quick start control voltage VQ (Step S14), and when the quick start control voltage VQ is less than the reference voltage VREF ("No," in Step S14), the logic circuit 72 again sets the first quick start control signal SC to a high level, and the routine jumps to Step S10 again. As a result, the first quick start control transistor 53 and second quick start control transistor 54 are switched OFF (Step S15).

In the determination of Step S14, when the quick start control voltage VQ is equal or greater than the reference voltage VREF ("Yes," in Step S14), the charging voltage detection result signal SI is set to a high level.

The logic circuit 72 thereby sets the first quick start control signal SC and second quick start control signal SD to a low level. As a result, the first quick start control transistor 53 and second quick start control transistor 54 are switched ON (Step S16), and the first quick start diode 51 and second quick start diode 52 are bypassed.

More specifically, the quick start function is cancelled (Step S117), and the charging current IC flows in the following order: power source terminal SLRA, charging current detection transistor 41, second quick start control transistor 54, storage device 22, charging current transistor 48, and power source terminal SLRC.

The charging current transistor 48 is switched ON at this time, and the excess charge prevention transistor 45 is kept OFF (Step S18). When prescribed enable timing thereafter arrives ("Yes," in Step S19), the logic circuit 72 outputs an enable signal SL to the comparator 71, and the comparator 71 compares the reference voltage VREF and the voltage of the storage voltage signal SJ corresponding to the stored voltage of the storage device 22 (in essence, the excess charging prevention voltage VL obtained by dividing the storage voltage signal SJ in a second prescribed ratio) (Step 20). When the excess charging prevention voltage VL is equal to or greater than the reference voltage VREF ("Yes," in Step S20), the charging voltage detection result signal SI is set to a high level.

As a result, the logic circuit 72 sets the forced-cutoff signal SF to a low level and sets the blocking control signal SH (which is the output of the AND circuit 62) to a low level, further resulting in the charging current transistor 48 being forcibly switched OFF (Step S21).

The logic circuit 72 thereafter sets the excess charge prevention control signal SE to a low level, and the excess charge prevention transistor 45 is thereby switched ON (Step S22).

More specifically, the system enters an excess charging prevention state (Step S23); the charging current IC flows in the following order: power source terminal SLRA, charging current detection transistor 41, excess charge prevention transistor 45, and power source terminal SLRC; and excess charging of the storage device 22 is prevented.

When a prescribed enable timing arrives ("Yes," in Step S24), the logic circuit 72 thereafter again outputs an enable signal SL to the comparator 71, and the comparator 71 compares (Step S25) the reference voltage VREF and the voltage of the storage voltage signal SJ corresponding to the stored voltage of the storage device 22 (in essence, the excess charging prevention voltage VL obtained by dividing the storage voltage signal SJ in a second prescribed ratio). When the excess charging prevention voltage VL is equal to or greater than the reference voltage VREF ("No," in Step S25), the charging voltage detection result signal SI is set to a high level and the excess charging prevention state is maintained.

However, when the excess charging prevention voltage VL is less than the reference voltage VREF ("Yes," in Step S25), the comparator 71 sets the charging voltage detection result signal SI to a low level, and the logic circuit 72 thereby sets the excess charge prevention control signal SE to a high level. The excess charge prevention transistor 45 is thereby switched OFF (Step S26).

The logic circuit 72 thereafter sets the forced-cutoff signal SF to a high level, and sets the blocking control signal SH (which is the output of the AND circuit 62) to a high level. The forced OFF state of the charging current transistor 48 is therefore cancelled (Step S27).

The excess charging prevention state is also canceled (Step S28), and the charging current transistor 48 is thereafter switched ON or OFF in accordance with the presence of charging current IC, that is to say, in accordance with the level of the output signal of the comparator 61. In this case, the reason that the excess charge prevention transistor 45 and charging current transistor 48 are switched ON or OFF in a stepwise fashion in accordance with excess charging prevention control is that back flow current flows from the storage device 22 to both the transistors 45 and 48 when both transistors 45 and 48 are switched ON, inducing a reduction in charging efficiency.

Described next is an operation in the case in which power generation in the power generation apparatus 21 ends, and there is a possibility that backflow current will flow from the storage device 22 to the power generation apparatus 21.

Figure 7:
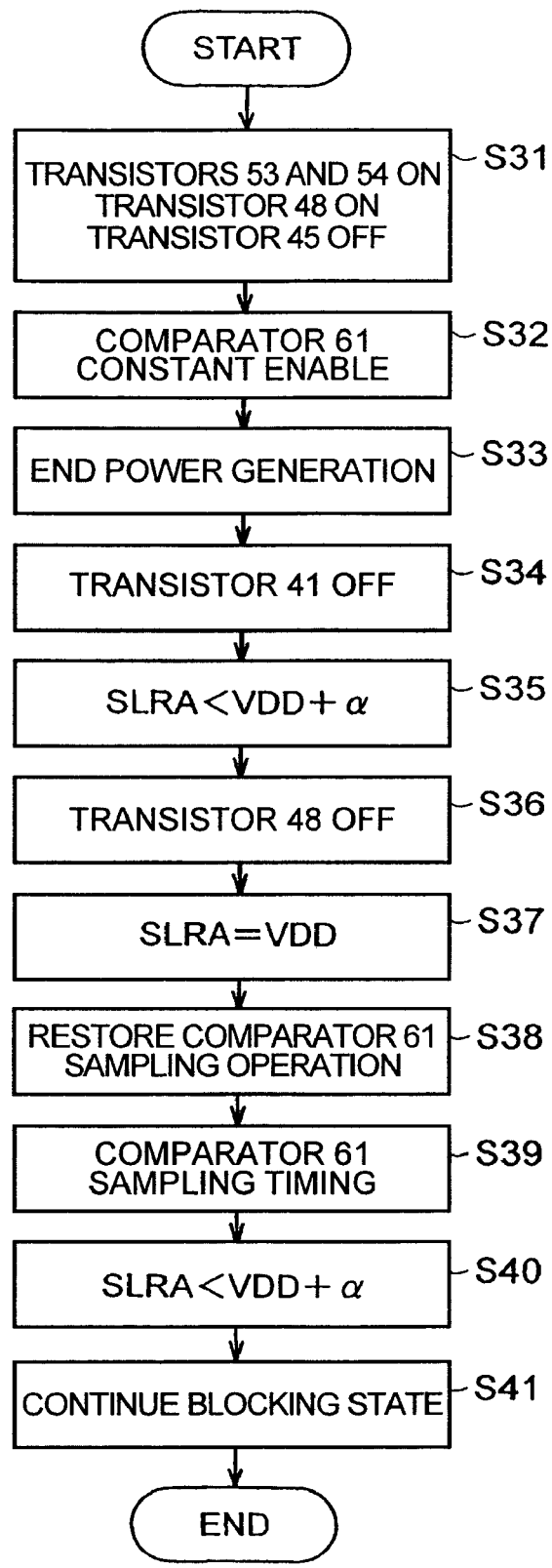
FIG. 7 is a view of an operation flowchart illustrating a case in which power generation has ended and there is a possibility that backflow current will flow from the storage device toward the power generation apparatus.

FIG. 7 is a view of an operation flowchart of the case in which power generation has ended and there is a possibility that backflow current will flow from the storage device toward the power generation apparatus In a state in which the power generation apparatus 21 generates power and charging current IC is flowing, the first quick start transistor 53 and second quick start transistor 54 are both switched ON, the charging current transistor 48 is switched ON, and the excess charge prevention transistor 45 is switched OFF (Step S31).

In this case, since charging current IC is flowing, the sampling timing signal SM constantly enables the comparator 61 of the comparator unit 46 (Step S32).

When the power generation apparatus 21 thereafter ends power generation (Step S33), the voltage between the drain and source of the charging current detection transistor 41 becomes equal to the voltage of the higher-potential power source VDD via the pull-up resistance 43, and the charging current detection transistor 41 is switched OFF (Step S34).

In this state, the backflow current IR flows in the following pathway: storage device, second quick start transistor 54, pull-up resistance 43, power source terminal SLRA, power generation apparatus 21, power source terminal SLRC, and charging current transistor 48.

At this point, the comparator 61 of the comparator unit 46 compares the voltage of the reference voltage signal SB (equivalent to the voltage of the higher-potential power source VDD) and the power generation voltage signal SA (Step S35), and since the voltage of the power generation voltage signal SA is less than the voltage obtained by adding the voltage VDS between the drain and source of the charging current detection transistor 41 to the voltage of the higher-potential power source VDD, the charging current is not detected and the output signal is set to a low level.

As a result, the blocking control signal SH (which is the output of the AND circuit 62) is set to a low level. The forced OFF state of the charging current transistor 48 is therefore cancelled (Step S36).

A further result is that the backflow current IR is completely cut off, and the power source terminal SLRA is pulled up to the voltage of the higher-potential power source VDD by the pull-up resistance 43 (Step S37). Since the blocking control signal SH has been set to a low level, the logic circuit 72 detects that charging current is not flowing, cancels the constantly enabled state of the comparator 61, and changes the sampling timing signal SM so that the comparator 61 becomes enabled at each prescribed sampling timing cycle (Step S38).

At the point in time that the sampling timing signal SM enables the comparator 61 (Step S39), the AND circuit 62 continues to output a blocking control signal SH at a low level as long as the power generation voltage signal SA (which is the voltage of the power source terminal SLRA) is still less than the voltage obtained by adding the voltage VDS between the drain and source of the charging current detection transistor 41 to the voltage of the higher-potential power source VDD, and the blocking state will be continued (Step S41).

As described above, in accordance with the present embodiment, the charging loss and leak current of the power supply control circuit can be considerably reduced. As a result, the charging efficiency of a power generation apparatus or an electronic apparatus provided with a power generation apparatus can be improved, and the drivable length of time of the electronic apparatus can be extended.

In the description above, two quick start diodes are connected in series and operated until just prior to quick start cancellation. The first quick start diode is bypassed and the second quick start diode is bypassed in sequence in a quick start-cancelled state, but it is also possible to provide a configuration in which the first quick start diode is bypassed and the second quick start diode is bypassed in sequence in accordance with the voltage of the higher-potential power source VDD or the charging current of the storage device in a quick start state in order to improve the charging efficiency in the quick start state.

In the description above, the type of MOSFET constituting the charging current detection transistor 41 and the type of MOSFET constituting the charging current transistor 48 were described in detail, but a configuration may be used in which both of the MOSFETs may be enhancement-type field-effect transistors, or the MOSFET constituting the charging current detection transistor 41 may be a depletion-type field-effect transistor, and the MOSFET constituting the charging current transistor 48 may be an enhancement-type field-effect transistor.

In the description above, the electronic apparatus was provided with both a power generation apparatus and a storage device as power supply apparatuses, but application can also be made to an electronic apparatus provided solely with a storage device as long as an external power supply apparatus (power generation apparatus) can be connected.

In the description above, a plurality of components were used in combination as the power supply controller 26, but also possible is an integrated configuration in which a semiconductor integrated circuit (semiconductor device) is used. The power supply controller 26 and controller 27 were described as separate units, but also possible is a semiconductor integrated circuit (LSI circuit, for example) configuration in which the components are integrally formed on a semiconductor substrate.

In the description above, control was implemented with a logic circuit configuration, but control programs may also be stored in an EEPROM or other memory to perform control routines with a microcomputer. In this case, it is also possible to store control programs in advance on any type of magnetic disk, optical disk, memory card, or other recording medium, and to read and install the programs from the recording medium. Also possible is a configuration in which a communication interface is provided, control programs are downloaded via the Internet, a LAN, or another network, and the programs are installed and executed.

Described above is the case in which the MPU 34 of the controller 27 operates in a normal fashion, but control of the power supply controller 26 is preferably made entirely independent from the control of the controller 27, even when the stored voltage of the storage device 22 is low and the MPU 34 has malfunctioned. Adopting such a configuration makes it possible to prevent situations in which a malfunction of the MPU 32 causes backflow current to flow accidentally from the storage device 22 to the power generation apparatus 21, excess charging to be prevented, and the storage device 22 not to be able to be charged by the power generation apparatus 21.

In the description above, the charging current detection transistor 41 is composed of a p-channel MOSFET and the charging current transistor 48 is composed of an n-channel MOSFET, but it is also possible to change the logic such that the charging current detection transistor 41 is composed of an n-channel MOSFET and the charging current transistor 48 is composed of a p-channel MOSFET. The same applies to other transistors.

In the description above, a p-channel MOSFET with a low threshold is used as the charging current detection transistor 41, but since a blocking unit is provided in which a charging current transistor 48 is used that can reliably prevent backflow current, it is possible to replace the charging current detection transistor 41 with an internally or externally mounted Schottky-barrier diode or other diode that normally cannot be adopted because of its low forward voltage but a considerable leak electric current.

Described above is the case in which a solar battery is used as the power supply apparatus (power generation apparatus), but also possible are configurations in which are used an electromagnetic power generation apparatus or another electromagnetic induction power generation apparatus that converts kinetic energy (rotational kinetic energy of a oscillating weight, for example) into electrical energy, a thermoelectric power generation apparatus that converts thermal energy (thermal energy originating from the difference in body temperature and the surrounding air temperature, for example) into electrical energy, a piezoelectric effect power generation apparatus that generates power by using the piezoelectric effect through the application of vibrations or displacement produced externally or by self-excitation, or an electromagnetic induction power generator that receives broadcast, communication radio waves, or other freely propagating electromagnetic waves, and makes use of the energy thereof (corresponding to a first energy).

Described above is the case in which a power supply apparatus is used as the power generation apparatus, but any apparatus that supplies power may be applied, even if the system does not have a power generation function such as a power adapter or a charging station for a mobile phone or the like.

As used herein, the following directional terms "forward, rearward, above, downward, vertical, horizontal, below, and transverse" as well as any other similar directional terms refer to those directions of a device equipped with the present invention. Accordingly, these terms, as utilized to describe the present invention should be interpreted relative to a device equipped with the present invention.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A power supply control circuit interposed between a power supply apparatus and a storage device that stores power supplied by the power supply apparatus, the power supply control circuit controlling electric current that flows between the power supply apparatus and the storage device, the power supply control circuit comprising:

a charging current detector being configured to detect the charging current flowing from the power supply apparatus to the storage device;

a blocking unit being configured to cut off the backflow current flowing from the storage device to the power supply apparatus on the basis of an inputted blocking control signal; and a backflow monitoring unit having a comparator being configured to compare voltage on both ends of the charging current detector, the backflow monitoring unit being configured to monitor the presence of the charging current by sampling by the comparator, until the charging current is detected, the back flow monitoring unit being configured to monitor constantly the presence of the charging current by the comparator after the charging current has been detected, the back flow monitoring unit being configured to output a blocking control signal to cut off the backflow current when the charging current is not flowing.

2. The power supply control circuit according to claim 1, wherein the charging current detector includes a first field-effect transistor in which either one of the drain and source terminals is connected to the gate terminal, and is directly or indirectly connected to one of the terminals of the storage device, and in which the other of the drain and source terminals is connected to one of the terminals of the power supply apparatus, and the blocking unit includes a second field-effect transistor in which either one of the drain and source terminals is connected to the other terminal of the power supply apparatus, and in which the other of the drain and source terminals is directly or indirectly connected to the other terminal of the storage device.

3. The power supply control circuit according to claim 2, wherein the second field-effect transistor is configured with a larger threshold value than the threshold value of the first field-effect transistor.

4. The power supply control circuit according to claim 3, wherein the first field-effect transistor is formed from an intrinsic semiconductor, and the second field-effect transistor is configured so that the threshold value is set by controlling the concentration of impurities in the substrate.

5. The power supply control circuit according to claim 2, wherein parasitic diodes in which the direction of flow of the charging current is the forward direction are provided in parallel with the first field-effect transistor and the second field-effect transistor.

6. The power supply control circuit according to claim 2, wherein the first and second field-effect transistors are enhancement-type field-effect transistors.

7. The power supply control circuit according to claim 2, wherein the first field-effect transistor is a depletion-type field-effect transistor, and the second field-effect transistor is an enhancement-type field-effect transistor.

8. The power supply control circuit according to claim 2, wherein the backflow monitoring unit includes a comparator to detect a difference in electrical potential generated between the drain and source terminals of the first field-effect transistor, and the comparator takes samples in a state allowing backflow current to flow based on the difference in electrical potential, and constantly operates in a state in which the charging current is flowing.

9. The power supply control circuit according to claim 8, wherein a resistance load element to stabilize the electrical potential of one of the terminals of the power supply apparatus is connected in parallel with the first field-effect transistor.

10. The power supply control circuit according to claim 1, wherein a power generation apparatus is connected as the power supply apparatus.

11. The power supply control circuit according to claim 10, wherein a constant-current power generation apparatus that causes a substantially constant charging current to flow without dependence on the storage voltage until the storage voltage of the storage device reaches a prescribed level under prescribed power generation conditions is connected as the power supply apparatus.

12. The power supply control circuit according to claim 2, further comprising a switching element configured to prevent overcharging of the storage device and to allow charging current fed from the power supply apparatus to flow to the power supply apparatus via the first field-effect transistor, wherein the backflow monitoring unit includes a storage voltage detector to detect the storage voltage of the storage device, and to set forcibly the second field-effect transistor in an OFF state, and thereafter to set the switching element in an ON state when the storage voltage of the storage device is equal to or greater than a prescribed reference voltage, and when the second field-effect transistor is forcibly set in the OFF state and the switching element is set on the ON state, the switching element is set in the OFF state and the forcibly set OFF state of the second field-effect transistor is released when the storage voltage is less than the reference voltage.

13. An electronic apparatus, comprising:

a storage device being configured to store power supplied by an external power supply apparatus;

a controlled device being configured to be driven by the stored power of said storage device; and a power supply control circuit being interposed between said power supply apparatus and said storage device, and being configured to control the electric current flowing between said power supply apparatus and said storage device, said power supply control circuit including a charging current detector being configured to detect charging current flowing from said power supply apparatus to said storage device, a blocking unit being configured to cut off backflow current flowing from said storage device to said power supply apparatus on the basis of an inputted backflow control signal, and a backflow monitoring unit having a comparator being configured to compare voltage on both ends of the charging current detector, the backflow monitoring unit being configured to monitor the presence of the charging current by sampling by the comparator, until the charging current is detected, the backflow monitoring unit being configured to monitor constantly for the presence of the charging current by the comparator after the charging current has been detected, the backflow monitoring unit being configured to output a blocking control signal to cut off the backflow current when the charging current is not flowing.

14. An electronic apparatus comprising:

a power supply apparatus;

a storage device being configured to store power supplied by said power supply apparatus;

a controlled device being configured to be driven by the stored power of said storage device; and a power supply control circuit being interposed between said power supply apparatus and said storage device to control the electric current that flows between said power supply apparatus and said storage device, said power supply control circuit including a charging current detector being configured to detect charging current flowing from said power supply apparatus to said storage device, a blocking unit being configured to cut off backflow current flowing from said storage device to said power supply apparatus on the basis of an inputted backflow control signal, and a backflow monitoring unit having a comparator being configured to compare voltage on both ends of the charging current detector, the backflow monitoring unit being configured to monitor for the presence of the charging current by sampling by the comparator, until the charging current is detected, the backflow monitoring unit being configured to monitor constantly for the presence of the charging current by the comparator after the charging current has been detected, the backflow monitoring unit being configured to output a blocking control signal to cut off the backflow current when the charging current is not flowing.

15. The electronic apparatus according to claim 14, wherein
said controlled device is a microcomputer.

16. The electronic apparatus according to claim 15, wherein
said microcomputer includes a central processing unit, and
the control of said power supply control apparatus is carried out independently from the control of said central processing unit.

17. The electronic apparatus according to claim 16, wherein
said controlled device is a timing device having a timing function and a time display function.

18. The electronic apparatus according to claim 17, wherein
said power supply apparatus is a power generation apparatus.

19. The electronic apparatus according to claim 14, wherein
said controlled device is a timing device having a timing function and a time display function.

20. The electronic apparatus according to claim 19, wherein
said power supply apparatus is a power generation apparatus.

21. The electronic apparatus according to claim 14, wherein said power supply apparatus is a power generation apparatus.

22. A semiconductor device, comprising:
a terminal being connected to a power supply apparatus;
a terminal being connected to a storage device;
a terminal being connected to a controlled device driven with the stored power of the storage device; and
the power supply control circuit in accordance with claim 1.

23. A control method comprising:
preparing a control unit of a power supply apparatus to control electric current between a power supply apparatus and a storage device;
inserting said control unit between said power supply apparatus and said storage device;
detecting charging current flowing from said power supply apparatus to said storage device by using a charging current detector;
monitoring the presence of the charging current by sampling by comparing voltage on both ends of the charging current detector, until the charging current is detected, and constantly monitoring the presence of charging current by comparing the voltage on both ends of the charging current detector, after the charging current has been detected; and
cutting off backflow current flowing from said storage device to said power supply apparatus when the charging current is not flowing.

24. A control method comprising:
preparing an electronic apparatus housing a power supply apparatus or to which an external power supply apparatus is connected, the electronic apparatus having
a storage device being charged by said power supply apparatus,
a controlled device being driven with the stored power of said storage device, and
a power supply control circuit being interposed between said power supply apparatus and said storage device to control the electric current that flows between said power supply apparatus and said storage device;
detecting charging current flowing from said power supply apparatus to said storage device by using a charging current detector;
monitoring the presence of the charging current by sampling by comparing voltage on both sides of the charging current detector, until the charging current is detected, and constantly monitoring the presence of charging current by comparing the voltage on both sides of the charging current detector after the charging current has been detected; and
cutting off backflow current flowing from said storage device to said power supply apparatus when the charging current is not flowing.

* * * * *